INVENTOR.
Masayoshi Nomura
Takeshi Tokuyama
Shoji Tauchi
Takeshi Tagaki

Mestern & Mestern

METHOD OF FORMING A SEMICONDUCTOR DEVICE BY ETCHING AND EPITAXIAL DEPOSITION

Filed Sept. 23, 1964

INVENTOR.
Masayoshi Nomura
Takeshi Tokuyama
Shoji Tauchi
Takeshi Takagi

Wlesteen & Westem

INVENTOR.
Masayoshi Nomura
Takashi Tokuyama
Sōji Tauchi
Takeshi Takagi

Meston & Meston

United States Patent Office 3,345,222

Patented Oct. 3, 1967

3,345,222

METHOD OF FORMING A SEMICONDUCTOR DEVICE BY ETCHING AND EPITAXIAL DEPOSITION

Masayoshi Nomura, Kodaira-shi, Takashi Tokuyama, Hoya-machi, Kitatama-gun, Tokyo-to, Shoji Tauchi, Kokubunji-machi, Kitatama-gun, Tokyo-to, and Takeshi Takagi, Musashino-shi, Japan, assignors to Kabushiki Kaisha Hitachi Seisakusho, Tokyo-to, Japan, a joint-stock company of Japan Filed Sept. 23, 1964, Ser. No. 398,696

Claims priority, application Japan, Sept. 28, 1963, 38/51,636, 38/51,637

9 Claims. (Cl. 148—175)

ABSTRACT OF THE DISCLOSURE

A method of manufacturing a semiconductor by placing the semiconductor in a reaction action chamber, etching it with a vapor phase of halogenated semiconductor material and hydrogen, subsequently causing an epitaxial layer of apposite conductivity to form on the semiconductor material and the gases by changing the molar ratio of the gases and finally forming a silicon dioxide coat on the surface of the semiconductor material.

This invention relates to semiconductor devices, particularly epitaxial semiconductor devices, and to a method for fabricating the same.

It is an object of the present invention to provide new semiconductor devices, and to a method for fabricating the same.

It is an object of the present invention to provide new semiconductor devices having very few surface defects and very small quantities of impurities and having excellent junctions such as $p^+p$, $n^+n$, and pn, $p^+n$ junctions.

It is another object to provide a method for fabricating semiconductor devices of the above stated character.

It is still another object to provide an effective method for forming a protective film on the above stated semiconductor devices for surface passivation thereof.

It is a further object to provide new techniques in the production of semiconductor devices, particularly a continuous process for practicing the two above stated methods.

It is a still further object to provide a new method for producing semiconductor devices wherein vapor etching, formation of epitaxial layer, formation of protective film, impurity diffusion, and other steps are carried out continuously.

The nature, principle, and details of the invention, as well as other objects and advantages thereof, will be best understood by reference to the following description, taken in conjunction with the accompanying drawings in which like parts are designated by like reference characters, and in which.

Figures 3A, 3B, 3C:
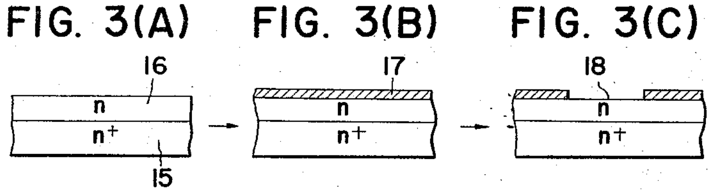
Figures 3D, 3E, 3F:
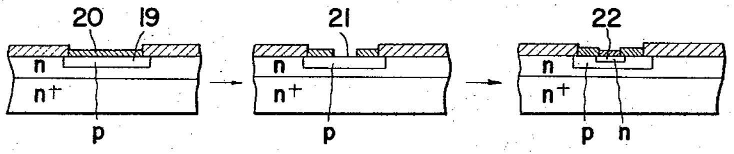
Figures 4A, 4B, 4C:
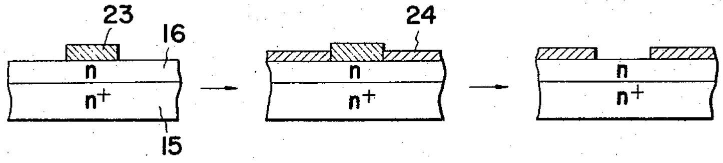
Figure 5A:
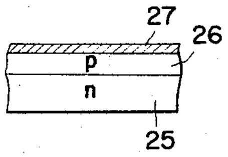
Figure 5B:
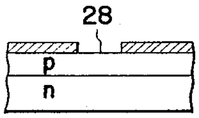
Figure 5C:
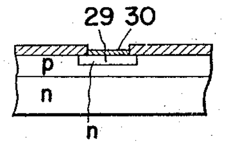
Figure 5D:
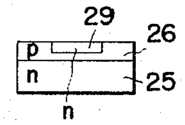
Figure 5E:
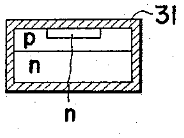
Figure 5F:
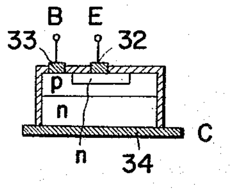
Figure 6A:
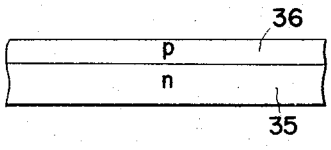
Figure 6B:
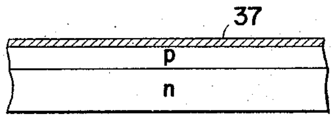
Figure 6C:
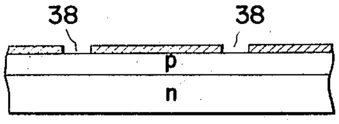
Figure 6D:
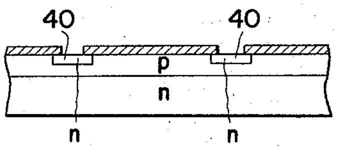
Figure 6E:
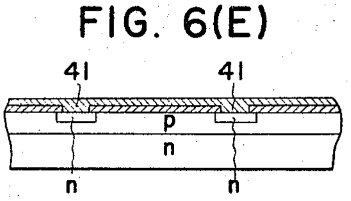
Figure 6F:
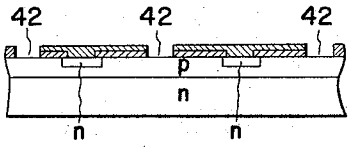
Figure 6G:
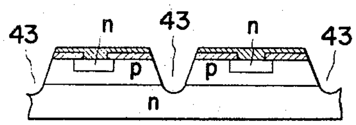
Figure 6H:
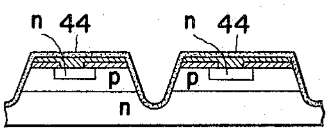
Figure 6I:
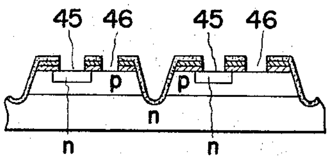
Figure 6J:
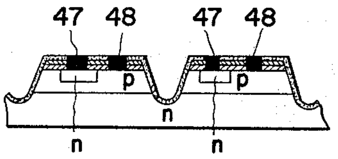
Figure 6K:
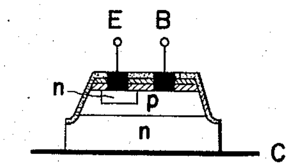

FIGURES 3(*a*) through 3(*f*), inclusive, are fragmentary sectional views showing progressive states of a semiconductor device during its fabrication according to one embodiment the invention;

FIGURES 4(*a*), 4(*b*), and 4(*c*) are similar views showing progressive states of a semiconductor device according to another embodiment of the invention;

FIGURES 5(*a*) through 5(*f*), inclusive, are similar views showing progressive states according to still another embodiment of the invention as applied to an epitaxial planar-type transistor; and FIGURES 6(*a*) through 6(*k*), inclusive, are similar views showing progressive states according to a further embodiment of the invention as applied to an epitaxial mesa-type transistor.

As conductive to a full appreciation of the utility of the present invention, the following brief consideration of the prior art is believed to be useful.

The heretofore commonly practiced method of forming an epitaxial layer comprises: placing a semiconductor element sample such as silicon and germanium in a quartz reaction tube; introducing into the quartz reaction tube a halogen compound such as $SiCl_4$, $SiHCl_3$, $SiBr_4$, and $SiI_4$, or $GeCl_4$ and $GeI_4$ in vapor form either singly or together with $H_2$ gas; and heating the sample at the required temperature (for example, 800 to 1,300 deg. C. in the case of silicon; and 400 to 900 deg. C. in the case of germanium), thereby to cause epitaxial growth of silicon or germanium on the substrate crystal by thermal decomposition or hydrogen reduction of the halogen compound vapor.

Figure 1:
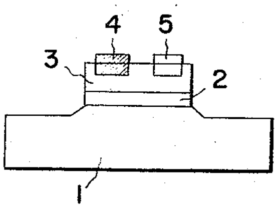
FIGURE 1 is a sectional view showing the construction of an epitaxial mesa-type transistor of known type.

As representative semiconductor devices in which the above stated method is utilized, there are epitaxial mesa transistors. One example in which germanium is used will now be briefly described with reference to FIGURE 1. On a germanium substrate 1 of p-type conductivity and low resistivity, for example, of the order of from 0.01 to 0.001 ohm-cm., an epitaxial growth layer 2 of the same conductivity type and a resistivity of approximately 1 ohm-cm. is formed. Then, on this epitaxial layer 2 an n-type impurity is caused to diffuse to form an n-type diffusion layer 3 (base layer). Thereafter, aluminum and a gold-antimony alloy are respectively evaporation deposited in vacuum on the diffusion layer 3 for the purpose of forming an emitter region and a base region, respectively, and these metals so deposited are alloyed by means of a special jig. In FIGURE 1, reference numerals 4 and 5 respectively designate emitter and base electrodes. Then the device is chemically etched to provide the required mesa area, whereupon a mesa type semiconductor is obtained.

When an epitaxial layer is formed by the conventional method described above, crystal defects such as protrusions and stacking faults occur, the defects being concentrated particularly in the interface between the substrate crystal and the epitaxial layer. As a result of this disadvantageous feature, an epitaxy can be used only in the case where, on a low-resistivity crystal, an epitaxial layer of the same conductivity type is to be formed. Even if it were possible to apply an epitaxy directly to the fabrication of a semiconductor having a pn junction as in the case of transistors, for example, to the formation of a p-type epitaxial layer on an n-type semiconductor substrate, the resulting crystal defects would be numerous, and the product would be almost useless for practical use.

This disadvantageous feature is caused by the presence on the substrate crystal surface of dust of foreign substances and minute quantities of impurities (for example, impurities such as contaminants, chemicals, and oxide layers which could not be completely removed by the water washing subsequent to chemical etching) or polishing distortions and mechanical damage in the substrate. As far as we are aware, the prior art has been unable to completely remove these defects and, to date, has been unable to provide an epitaxial pn junction having completely satisfactory characteristics.

On the other hand, it is a general practice, in order to stabilize the electrical characteristics of a semiconductor device, especially a pn junction, to cover principally the pn junction exposed on the device surface with an oxide film. Particularly in the case where the semiconductor substrate is silicon, the general practice is to cause the silicon to oxidize in an oxidizing atmosphere at a high temperature, thereby to form an oxide film of $SiO_2$ on the surface. Such an oxide film functions as a protective film for the semiconductor device and, moreover, is quite useful as a mask for impurity diffusion.

However, by the conventional methods for forming oxide films, minute quantities of contaminants such as dust and impurities are present on the surface of the substrate silicon, and, during the diffusion process step, the impurities diffuse into the silicon substrate, giving rise to results such as the formation of an unexpected diffusion layer, the occurrence of defects in the oxide film due to dust, impurities, and the like as described above because of the formation of the oxide film at a high temperature, and uneven film. In such a case, if the semiconductor device is a transistor, a lowering of the breakdown voltage will occur, thereby causing a lowering of the current amplification factor. Furthermore, if the general method of forming the oxide film on a silicon substrate surface with steam is resorted to, there will occur a loss of the silicon substrate surface, accumulation of impurities on the substrate surface, transformation of the substrate surface into one of n-type conductivity, and other effects, whereby a new channel will be formed.

The present inventors have previously pointed out the above mentioned difficulties encountered in the prior art and have proposed a method for overcoming the same. That is, the present inventors have proposed a method of forming an epitaxial growth layer on the surface of a substrate crystal which method comprises vapor etching the substrate crystal surface in a gaseous mixture of the halide of the semiconductor to form the epitaxial layer and hydrogen gas, as the mol ratio of the halide and hydrogen is controlled, completely removing dust and impurities on the substrate surface, completely removing defects such as surface polishing distortions and surface damage, cleaning the surface to expose a flat crystal surface, and then controlling said mol ratio to form the epitaxial growth layer on the substrate surface.

By this new method for forming epitaxial growth layers, epitaxial layers with very few defects can be formed, and the formation of pn junctions due to epitaxial layers, which formerly had been considered to be difficult, is facilitated.

While, in the method according to the invention of the above reference, only the mol ratio of the semiconductor halide and hydrogen gas is controlled, we have further found that the conditions of this vapor etching vary also with the flowrate of the gaseous mixture and the substrate tempirature, in addition to the mol ratio.

Furthermore, the present inventors have discovered that, in the formation of an oxide film on the surface of a semiconductor device, for example, a silicon semiconductor device, this film can be formed also by the thermal decomposition of an organo-oxysilane, and that, in the formation of an oxide film by this method, the film formation temperature is extremely low, and the strength of the resulting film, moreover, is not greatly different from that of a film obtained by the use of an oxygen atmosphere.

The present inventors have made a further discovery and confirmed experimentally that an oxide film can be also formed on the surface of a silicon sample at a low temperature of approximately 700 deg. C. in vapor of lead oxide in the method for forming an oxide film of silicon by low-temperature oxidation. The mechanical strength of a film so formed has been found to be higher than those of known oxide films.

On the basis of the above described findings, the present invention, in its broad aspect, contemplates the provision of new semiconductor devices and a method for fabricating the same wherein the technical difficulties encountered heretofore are overcome.

Briefly stated, the invention resides in a method for production of semiconductor devices wherein the vapor etching technique which was previously proposed and a low-temperature oxidation technique are integrally, logically, and effectively coupled and in semiconductor devices so produced.

More specifically, the method according to the invention may be generally practiced by vapor etching in an atmosphere of a gaseous mixture the surface of a substrate semiconductor crystal on which an epitaxial growth layer is to be formed, the vapor etching conditions such as the mol ratio of the gaseous mixture introduced, the flowrate of the mixture, and the temperature of the substrate being suitably selected, thereby to expose a good crystal surface, then causing the growth of an epitaxial layer on the surface of the substrate, and then forming a protective film on the resulting epitaxial semiconductor device by the aforementioned low-temperature oxidation technique.

The oxide film so formed not only serves as a protective film but can also be used as a mask in the process of vapor diffusion of an impurity. In the case where the substrate crystal is a silicon crystal, an oxide film can be obtained by heating the crystal in an oxygen atmosphere. In the method of this invention, however, thermal decomposition of an organo-oxysilane is generally used for forming an oxide film on various semiconductor substrate crystals including silicon crystals.

Since the oxide film, in the method of this invention, is formed immediately after the formation of the epitaxial layer, it is possible to prevent the various adverse effects due to contaminants such as dust which are introduced at the time of the impurity diffusion process.

In general, the method of this invention may be practiced by continuously carrying out the process steps of vapor etching, epitaxial layer formation, and oxide film formation in the same apparatus without moving the sample, only the reaction gases being switched. However, when necessary, the process apparatus can be so adapted that the sample is moved and caused to pass through parts of the apparatus respectively containing different reaction gases, whereby the above stated three process steps are accomplished successively in a continuous manner.

In order to indicate still more fully the nature of the present invention, the following examples of typical procedure in the vapor etching of a silicon semiconductor crystal, causing epitaxial growth, and forming an oxide film on the surface of the sample by a low-temperature, low-pressure technique, all according to the invention, are set forth, it being understood that these examples are presented as illustrative only and are not intended to limit the scope of the invention.

*Example 1*

Figure 2:
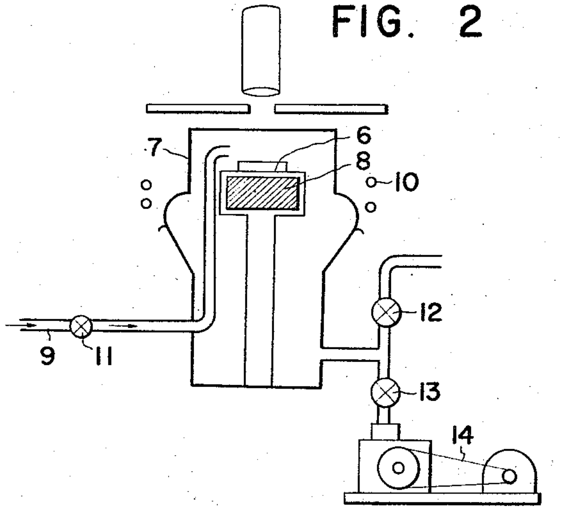
FIGURE 2 is an enlarged schematic diagram showing the essential parts of a quartz reactor suitable for practice of the invention.

First, as indicated in FIGURE 2, a silicon substrate crystal of the required size is cut out by a known method and subjected to mechanical lapping. Then the crystal is provided with a mirror plane by chemical etching or electropolishing, and the resulting sample 6 is then placed on the upper surface of a graphite heating platform 8 disposed within a quartz reactor 7.

Then, through a gas inlet 9 of the reactor 7, hydrogen gas ($H_2$) is introduced into the region surrounding the sample 6 at a flowrate of 1.5 liters per minute. In this atmosphere of $H_2$, the silicon sample 6 is heated to a temperature of 1,270 deg. C. by R.F. induction produced by a R.F. induction coil 10.

Under these conditions, $SiCl_4$ vapor is mixed into the $H_2$ stream so as to provide the reactor interior with a stream of a gaseous mixture, $SiCl_4+H_2$. The flowrate of the $SiCl_4$ gas is controlled so that the mol ratio of this mixture becomes 0.16, whereupon the silicon crystal surface is vapor etched, and contaminants such as dust and impurities adhering to the crystal surface are removed, whereby, in approximately one minute, a clean, flat surface without unevenness is exposed. In one instance, the vapor etching rate was found to be 8.8 microns per minute.

Next, the mol ratio of gaseous mixture introduced into the reactor is lowered to 0.08, whereupon the $SiCl_4$ vapor is reduced on the substrate crystal surface by the $H_2$ gas, and silicon undergoes epitaxial growth on the crystal surface. During this process step there are no changes in the substrate temperature and flowrate of the gaseous mixture. In one instance, the epitaxial growth rate was 2.3 microns per minute. The epitaxial layer so obtained has almost no crystal defects and is flat.

When an epitaxial layer of the desired thickness has been obtained, the gas introduced is changed to only $H_2$ gas, and the silicon crystal temperature is lowered to 700 deg. C. When the crystal temperature has stabilized, valves 11 and 12 as shown in FIGURE 2 are closed to stop the flow of the $H_2$ gas.

Next, a valve 13 is opened, and a vacuum pump 14 is operated to evacuate the reactor interior to approximately $10^{-3}$ mm. Hg, whereupon the valves are returned to their original states. Then, this time, an organo-oxysilane gas is introduced continuously through the gas inlet 9. When this state is maintained for approximately 30 minutes, an oxide film ($SiO_2$) of approximately 0.5-micron thickness is deposited uniformly on the aforementioned epitaxial layer. In this case, the temperature of the organo-oxysilane (for example, tetra-ethoxysilane $$(C_2H_5O)_4Si)$$

and the vapor pressure are respectively maintained at 25 deg. C. and 2 mm. Hg.

By carrying out continuously the above described process steps, it is possible to carry out successively and continuously within the same apparatus the process step of vapor etching the silicon substrate to render its surface clean and flat, the process step of causing, by a method of hydrogen reducing of $SiCl_4$, the growth of an epitaxial layer of silicon on said surface, and the process step of depositing an oxide film on the resulting epitaxial layer. Accordingly, each of the layers so formed are prevented from being contaminated, whereby an almost perfect epitaxial semiconductor device is produced.

By introducing, in the above described process of causing growth of the epitaxial layer, the impurity, in vapor form, for determining the conductivity type of the epitaxial layer (for example, said vapor to become an acceptor being a group III halide such as $BBr_3$, $GaCl_3$, $InCl_3$, and that to become a donor being a group V halide such as $PCl_3$ or $SbCl_3$) together with the $SiCl_4$ and $H_2$ into the reactor, layers differing in resistivity and layers differing in conductivity type with respect to the substrate semiconductor crystal can be readily formed.

Furthermore, by suitably varying as desired the conditions of vapor etching and formation of the epitaxial layer, semiconductor devices of various constructional types such as $p^+p$, $n^+n$, pn, pnp, npn, and pnpn can be readily formed.

*Example 2*

The procedure of this example is the same as that set forth in Example 1 from the forming of the crystal, through vapor etching, and through the epitaxial layer growth.

When an epitaxial layer of the desired thickness and conductivity type has been obtained, the gas within the quartz reactor is changed to only $H_2$, and under the conditions then existing, the substrate crystal temperature is lowered to 700 deg. C. Next, the $H_2$ flow is stopped, and, in its place, tetra-ethoxysilane is caused to flow into the reactor together with nitrogen, argon, or oxygen gas as a carrier gas. After approximately 30 minutes, in one instance, an oxide film of approximately 1-micron thickness was deposited on the epitaxial layer.

*Example 3*

The same procedure for silicon crystal forming, vapor etching, and epitaxial growth as set forth in Example 1 was carried out.

When an epitaxial layer of the desired thickness was obtained, the gas supplied into the quartz reactor was changed to nitrogen ($N_2$), and the silicon substrate crystal temperature was lowered to 700 deg. C. Then the nitrogen gas flow was stopped, and PbO vapor was caused to flow together with oxygen gas ($O_2$) into the reactor, whereupon, in approximately 30 minutes, an oxide layer of 0.6-micron thickness was produced on the surface of the epitaxial layer.

*Example 4*

The same procedure for silicon crystal forming and vapor etching as set forth in Example 1 is carried out. Thereafter, the supply of $SiCl_4$ vapor is stopped, and the gas is changed to only $H_2$. At the same time, the substrate crystal temperature is lowered to 1,000 deg. C., after which the $H_2$ supply is stopped, and the interior of the reactor is evacuated. Then $SiHCl_3$ vapor is introduced into the reactor to form an epitaxial layer. Thereafter, an oxide layer is deposited or caused to grow on the silicon surface by a low temperature method.

*Example 5*

This example relates to a method for producing planar type semiconductor devices.

The fabrication process steps of this method are sequentially indicated in FIGURES 3(*a*) through 3(*f*), inclusive. First, a heavily doped silicon substrate wafer 15 of n-type to constitute a collector is prepared, and its surface is vapor etched. Then an epitaxial growth is caused so as to form an n-type epitaxial layer 16. The resistivity of this layer is higher than that of the substrate crystal, and its thickness is approximately 10 microns.

Next, on the resulting epitaxial layer 16, a silicon dioxide ($SiO_2$) layer 17 of 0.5-micron thickness is deposited by low-temperature oxidation (thermal decomposition of an organo-oxysilane) as indicated in FIGURE 3(*b*). Then, by a known photo-etching method a selected part 18 of the $SiO_2$ layer is removed. Thereafter, in an impurity diffusion furnace, vapor diffusion of boron is caused through this part 18, whereupon a boron diffusion layer 19 as indicated in FIGURE 3(*d*) is obtained. This layer 19 is of p-type conductivity and is of a depth of approximately 5 microns. During the formation of this diffusion layer 19, an oxide film 20 forms on the surface thereof.

Next, a selected part 21 (FIGURE 3(*e*)) of this oxide film 20 is removed. Through this part 21, phosphorus is caused to vapor diffuse into the substrate, whereby an n-type diffusion layer 22 of 2-micron thickness is formed as shown in FIGURE 3(*f*).

As a result an npn transistor element is obtained. By a known method, the oxide film is removed from selected parts of the element, and emitter, base, and collector electrodes are attached.

*Example 6*

In the procedure according to Example 5, prior to the formation of the oxide layer, a substance 23 such as, for example, a quartz plate, which is passive with respect to the substrate and, moreover, does not alloy with the substrate semiconductor at the temperature of formation of the oxide layer is placed on a selected part of the surface of the silicon sample as shown in FIGURE 4(*a*). At this time the substrate 15 and the substance 23 are preferably in a state of substantially close contact.

Next, as indicated in FIGURE 4(*b*), a silicon dioxide film 24 is deposited on the epitaxial layer 16 by thermal decomposition of an organo-oxysilane. Then the substance 23 (quartz plate) is removed, leaving an element wherein a selected surface not covered by an oxide film exists. Thereafter, selective diffusion of a p-type impurity and attachment of electrodes are carried out according to Example 5.

The description presented hereinafter relates to the most important embodiments of the invention.

*Example 7*

FIGURES 5(*a*) through 5(*f*), inclusive, indicate sequential process steps in the production of a new silicon epitaxial transistor of planar type.

First, a single crystal silicon substrate 25 of n-type conductivity to constitute a collector is prepared, and its surface is vapor etched. Then, from a gaseous mixture of $SiCl_4$ and $H_2$ with a further addition of BBr vapor, a p-type epitaxial layer 26 is caused to grow to a thickness of approximately 5 microns. Thereafter, an oxide film 27 is formed on the epitaxial layer by thermal decomposition of an organo-oxysilane.

Next, a hole is opened in a selected part 28 of the oxide film. While this hole may be formed, in general, by the photo-etching method, the method of using a substance such as a quartz plate as described in Example 6 is here advantageous in that this process step can be carried out within the same apparatus, whereby the infiltration of contaminants can be completely prevented.

Next, the atmosphere within the reactor is changed, and the exposed epitaxial layer is slightly vapor etched, thereby to produce a flat and clean crystal surface. This process step has the effect of producing excellent uniformity of impurity diffusion and of remarkably improving the flatness of the pn junction between the n-type and p-type layers.

Subsequently, in the same reactor, an n-type impurity is vapor diffused into the exposed epitaxial part by a known method, whereby a diffusion layer 29 and an oxide film 30 formed during the diffusion step are formed as shown in FIGURE 5(*c*). Then the resulting sample is chemically etched to remove the oxide film on its surface (FIGURE 5(*d*)), and then a new oxide film 31 is formed on the sample surface by thermal decomposition of an organo-oxysilane. The last two process steps are carried out for the following reason. Since the oxide film as indicated in FIGURE 5(*c*) is obtained during the impurity diffusion, it contains a large quantity of the impurity and is an undesirable oxide film. Accordingly, the use of this oxide film in the semiconductor device would have an undesirable effect on the electrical characteristics and life of the semiconductor device.

Then, by a known method, parts 32, 33, and 34 of the oxide film corresponding to the emitter, base, and collector parts are removed, and respectively to these parts, electrode metals 32 and 33 are secured by evaporation deposition, and electrode plate 34 is secured by soldering, whereupon an npn silicon transistor of a construction as shown in FIGURE 5(*f*) is obtained.

Since the transistor device produced by the method disclosed by the above Example 7 has a pn junction which is completely covered by an $SiO_2$ layer formed by low-temperature oxidation, it maintains extremely stable electrical characteristics against the effects of the surrounding atmosphere.

Moreover, since the base layer is formed, not by the diffusion method, but by the epitaxial method with substantially uniform impurity concentration, the capacity of the emitter-base junction is caused to be of a low value, and the breakdown voltage is caused to be high. Accordingly, the transistor dimensions for the same capacity value can be increased, whereby the yield, which tends to decrease with miniaturization, can be greatly improved, and the concentration of consumed power accompanying the increase in the junction area can be improved. As a result, the range of applicability of the element is greatly widened.

Still another desirable feature of a transistor produced by the above described procedure is that the collector-base junction formed by the epitaxial growth on the substrate, which is vapor etched at the time of the formation of the collector-base junction, has a high degree of perfection, whereby a breakdown voltage of the same order as that of an ordinary diffusion pn junction can be obtained.

Furthermore, the impurity concentration of the collector, even in the vicinity of the surface, is of a low value, in comparison with that due to the diffusion method, of approximately $5\times10^{15}$ cm.$^3$. Corresponding to a resistivity of approximately 1 ohm-cm. Therefore, even if the surface concentration resulting from the subsequent cancellation of this part and diffusion of the emitter region is caused to be lower than that obtainable by the conventional method, comparable electrical characteristics of the device can be obtained.

Still another advantageous feature is that the crystal defects due to lattice distortion caused by the impurity diffused in this part can be greatly reduced. This feature also contributes to the elevation of the breakdown voltage of the device and, moreover, greatly improves the noise characteristics due to the defects of the device.

*Example 8*

The sequential process steps in the production of a mesa type transistor according to the invention are indicated in FIGURES 6(*a*) through 6(*k*), inclusive.

First, as shown in FIGURE 6(*a*), an n-type silicon crystal substrate 35 to constitute a collector is prepared, and its surface is vapor etched to a depth of approximately 1 micron, a p-type epitaxial layer 36 then being grown on the surface so etched. Next, on the epitaxial layer 36, an oxide film is formed by thermal decomposition of an organo-oxysilane, after which selected parts, for example, the parts 38 in FIGURE 6(*c*), of the oxide film are removed by a known photo-etching method, thereby to expose selected parts of the epitaxial layer. For this step, the method of forming holes according to Example 6 in certain parts of the oxide film can also be resorted to.

Through the parts so exposed, an impurity of a conductivity opposite to that of the epitaxial layer is caused to diffuse, thereby to form an n-type diffusion layer 40. In general, in the process of forming a diffusion layer, water vapor is introduced together with the impurity in gaseous state to form the diffusion layer, whereupon an oxide film is formed simultaneously on the diffusion layer. By the method of this example, however, water vapor is not introduced, but the diffusion layer is formed by the us of a gaseous mixture of the impurity gas and a carrier gas such as, for example, hydrogen, nitrogen, and argon. Accordingly, an oxide film is not formed on the diffusion layer.

Next, on the exposed parts (diffusion layer) of the epitaxial layer, an oxide film is deposited by thermal decomposition of an organo-oxysilane. It should be mentioned here that the surface of the epitaxial layer may be vapor etched prior to the formation of the above mentioned diffusion layer or prior to the second oxide layer formation.

Thereafter, as indicated in FIGURE 6(*f*), selected parts (for example, parts at 42) of the oxide film are provided with linear grooves 42 for the purpose of etch-cutting, said grooves being formed by a photo-etching method or by a mechanical cutting method. In the next process step, the silicon layer so exposed is chemically etched, whereby large grooves 43 are formed as indicated in FIGURE 6(*g*). Instead of the etchant provided by chemical etching an etchant due to vapor etching may alternatively be used to afford equivalently effective results.

As is apparent from FIGURE 6(*g*), the grooves 43 completely cut the junction between the silicon substrate and the epitaxial layer. Since pn junction parts formed by the substrate and epitaxial layer are exposed by this process step, a third oxide film 44 is deposited again so as to completely cover the surfaces of the grooves 43, as indicated in FIGURE 6(*h*).

Thereafter, the parts 45 and 46 of the oxide film for the emitter and base electrodes are removed by a known photo-etching method to expose parts of the emitter region and the base region, as indicated in FIGURE 6(*i*). Then, as indicated in FIGURE 6(*j*), electrode metal 47 and 48 are deposited in said regions by a known vacuum evaporation deposition method. In general, evaporation deposition of a gold-antimony alloy is carried out for the emitter electrode metal 47, and that of aluminum is carried out for the base electrode metal 48.

The sample obtained by the above described process steps is cut along the grooves 43 by the known dicing method, thereby to produce a number of mesa-type transistor elements. Then, upon attaching electrodes respectively to the base B, emitter E, and the collector C of each element, epitaxial mesa-type transistors, each as shown in FIGURE 6(*k*), are obtained.

In the case of the above described example of embodiment of the invention, the collector resistance $R_{cs}$ can be further reduced by using an n-type silicon of low resistivity ($\rho$=0.01 ohm-cm.) for the substrate 35, causing an n-type epitaxial layer of 10-micron thickness and a resistivity of 1 ohm-cm. to grow on the substrate, and then forming the transistor structure by a known method.

As disclosed above, in the process of fabricating a mesa-type transistor according to the present invention, it is possible to reduce the production time for the base diffusion step, which possibility is a great advantage in the quantity (mass) production of the elements.

Furthermore, the invention affords the advantageous possibilities of lowering the emitter-base capacitance, attaining a larger junction area with the same external dimensions, and increasing the consumed power. In addition, the invention makes possible reduction of defects within the base layer in comparison with the defects caused the conventional double diffusion method, increase in the breakdown voltage, and great reduction of noise caused by defects.

Moreover, since continuous process steps are increased in the method according to this invention, contamination by the outside air is reduced, and the yield after the assembly of the elements is increased, whereby the production cost is reduced.

A further advantageous feature of the invention is that various changes can be made therein. For example, the etchant for vapor etching is not limited to a gaseous mixture of $SiCl_4$ and $H_2$, a gaseous mixture of $SiCl_4$ and $N_2$, or $Cl_2$ by itself, being usable. As another example, instead of hydrogen reduction of $SiCl_4$ for the formation of the epitaxial layer, the thermal decomposition of $SiHCl_3$ can be utilized. Furthermore, in addition to the low-temperature thermal decomposition of an organo-oxysilane as a method for depositing an oxide film, other methods such as those depending on the low-temperature, low-pressure thermal decomposition of an organo-oxysilane, high-temperature thermal decomposition of silane, and lead oxide vapor may be alternatively resorted to.

Moreover, by the practice of the present invention, various kinds of semiconductor devices can be produced as desired by utilizing various suitable combinations of process steps such as deposition of oxide film, vapor etching, and vapor diffusion.

Accordingly, it should be understood that the foregoing disclosure relates to only particular embodiments of the invention and that it is intended to cover all changes and modifications of the examples of the invention herein chosen for the purposes of the disclosure, which do not constitute departures from the spirit and scope of the invention as set forth in the appended claims.

What we claim is:

1. A method for the production of a semiconductor device having a protective layer on its surface which comprises the steps of preparing a silicon semiconductor substrate of a first conductivity type and subjecting its surface to a preliminary treatment; placing said substrate in a reaction chamber; introducing therein hydrogen gas; heating said substrate to a temperature of about 1,000° C. but below its melting point; chemically etching a selected surface of said substrate by introducing a halogenated semiconductor material in vapor phase into said chamber, the mol ratio of said halogenated material being at a predetermined value relative to said hydrogen gas; causing an epitaxial layer of a conductivity opposite that of said substrate to grow on the vapor-etched surface by reducing the mol ratio of hydrogen gas to halogenated material, and adding to this gas mixture an impurity gas capable of imparting said opposite conductivity type; stopping the supply of halogenated material and impurity gas; lowering the temperature of said substrate to substantially 700° C.; stopping the supply of hydrogen; and finally forming a silicon dioxide film on said substrate and epitaxial layer by introducing an organo-oxysilane vapor into said chamber.

2. The method as defined in claim 1, wherein said silicon dioxide film is formed by adding a gase selected from the group consisting of nitrogen, argon and oxygen to said organooxysilane.

3. The method as defined in claim 1, wherein said silicon dioxide film is formed by introducing, in lieu of an organo-oxysilane, a gaseous mixture of PbO and $O_2$.

4. The method as defined in claim 1, wherein said preliminary treatment consists of mechanical lapping and chemical etching.

5. The method as defined in claim 1, wherein said preliminary treatment consists of mechanical lapping and electrochemical etching.

6. A method for the production of a semiconductor device having a protective layer on its surface which comprises the steps of preparing a silicon semiconductor substrate of a first conductivity type and subjecting its surface to a preliminary treatment; placing said substrate in a reaction chamber; introducing therein hydrogen gas in an amount of substantially 1.5 liters per minute; heating said substrate to more than 1,270° C. but less than the melting point of silicon; vapor-etching the surface of said substrate by introducing $SiCl_4$ vapor at a molar ratio of $SiCl_4$ to hydrogen of substantially 0.16:1; forming an epitaxial layer of a conductivity type opposite that of said vapor-etched surface by adding an impurity gas capable of imparting said opposite conductivity; stopping the supply of hydrogen, $SiCl_4$ and impurity gas; subjecting said chamber to a vacuum of substantially $10^{-3}$ mm. Hg; lowering the temperature of said substrate to approximately 700° C.; and depositing a silicon dioxide film on said substrate by introducing an organo-oxysilane vapor into said chamber.

7. A method for the production of a semiconductor device having a protective layer on its surface which comprises the steps of preparing a silicone smiconductor substrate of a first conductivity type and subjecting its surface to a preliminary treatment; placing said substrate in a reaction chamber; introducing therein hydrogen gas at a rate of substantially 1.5 liters per minute; heating said substrate to more than 1,270° C. but below the melting point of silicon; vapor-etching the surface of said substrate by introducing $SiCl_4$ vapor at a molar ratio of $SiCl_4$ to hydrogen of substantially 0.16:1; stopping the supply of $SiCl_4$ and hydrogen; subjecting said chamber to a vacuum of substantially $10^{-3}$ mm. Hg; causing an epitaxial layer of a conductivity opposite to that of said vapor-etched substrate to grow on said surface by introducing into said chamber $SiHCl_3$ and an impurity gas capable of imparting said opposite conductivity; lowering the temperature of said substrate to approximately 700° C.; and depositing a silicon dioxide film thereon and on said epitaxial layer by pyrolysis of an organo-oxysilane introduced into said chamber.

8. A method for the production of a semiconductor device having a protective layer on its surface which comprises the steps of preparing a silicon semiconductor substrate of a first conductivity type and subjecting its surface to a preliminary treatment; placing said substrate in a reaction chamber; introducing therein hydrogen gas; heating said substrate to a temperature above 1,270° C. but below the melting point of silicon; vapor-etching said surface by the introduction of $SiCl_4$ vapor at a molar ratio thereof to hydrogen of 0.16:1; forming an epitaxial growth layer on the vapor-etched substrate by reducing said molar ratio to 0.08:1 and introducting an impurity gas of a conductivity type opposite that of said substrate; stopping the $SiCl_4$ supply and that of hydrogen and impurity gas; lowering the temperature of said substrate to approximately 700° C.; depositing a silicon dioxide film on said substrate and epitaxial growth layer of introducing the vapor of an organo-oxysilane into said chamber; exposing a portion of said growth layer to the external atmosphere by providing a hole in a selected part of said silicon dioxide film; slightly vapor-etching said exposed surface of said epitaxial growth layer; and diffusing an impurity of the first conductivity type through said hole on said silicon dioxide film.

9. A method for the production of a semiconductor device having a protective layer on its surface which comprises the steps of preparing a silicon semiconductor substrate of a first conductivity type and subjecting its surface to a preliminary treatment; placing said substrate in a reaction chamber; introducing therein hydrogen gas; heating said substrate to more than 1,270° C. but below the melting point of silicon; vapor-etching said surface by introducing vaporous $SiCl_4$ at a molar ratio thereof to hydrogen of 0.16:1; forming an epitaxial growth layer on the vapor-etched surface of opposite conductivity by reducing said molar ratio to 0.08:1 and introducing an impurity gas of opposite conductivity to that of said substrate; stopping the supply of hydrogen, $SiCl_4$ and impurity gas; lowering the temperature of said substrate to substantially 700° C.; depositing a silicon dioxide film on said surface and said epitaxial growth layer by introducing into said chamber vaporous organo-oxysilane; exposing a portion of said layer to the external atmosphere by providing a hole on a selected part of said silicon dioxide film on said layer; slightly vapor-etching the exposed surface portion; diffusing an impurity gas of like conductivity type as that of said substrate through said hole; and chemically etching a part of said layer and substrate to form a mesa portion of said epitaxial growth layer on the surface of said substrate, said mesa portion including the impurity diffusion layer.

References Cited

UNITED STATES PATENTS

| | | | |
|---|---|---|---|
| 3,111,590 | 11/1963 | Noyce | 148—186 X |
| 3,165,811 | 1/1965 | Kleimack | 148—175 X |
| 3,200,019 | 11/1965 | Scott | 148—187 |
| 3,243,323 | 3/1966 | Corrigan | 156—17 X |
| 3,275,910 | 9/1966 | Phillips | 148—33 |

HYLAND BIZOT, *Primary Examiner.*